United States Patent [19]
Cartwright

[11] Patent Number: 4,689,866
[45] Date of Patent: Sep. 1, 1987

[54] METHODS FOR TRANSFERRING SPRING CLIPS

[75] Inventor: John S. Cartwright, Hopewell Township, Mercer County, N.J.

[73] Assignee: American Telephone and Telegraph Company, AT&T Technologies, Inc., Berkeley Heights, N.J.

[21] Appl. No.: 817,652

[22] Filed: Jan. 10, 1986

Related U.S. Application Data

[62] Division of Ser. No. 683,065, Dec. 18, 1984, Pat. No. 4,582,245.

[51] Int. Cl.⁴ .............................................. B23K 31/02
[52] U.S. Cl. ..................................... 29/426.6; 29/428; 29/700; 29/526 R; 29/240
[58] Field of Search ...................... 29/240, 426.6, 428, 29/526 R, 700; 414/780, 783

[56] References Cited

U.S. PATENT DOCUMENTS

| | | | |
|---|---|---|---|
| 2,406,310 | 8/1946 | Agule | 113/112 |
| 2,411,439 | 11/1946 | Lee | 113/112 |
| 3,480,836 | 11/1969 | Aronstein | 228/180.2 X |
| 3,720,999 | 3/1973 | Nier | 29/840 |
| 3,849,838 | 11/1974 | Hehl | 29/739 |
| 3,887,998 | 6/1975 | Hartleroad | 228/180.2 |
| 3,930,297 | 1/1976 | Potucek et al. | 29/240 X |
| 4,371,912 | 2/1983 | Guzik | 228/180.2 |
| 4,545,761 | 10/1985 | Cartwright et al. | 228/212 |
| 4,582,245 | 4/1986 | Cartwright | 228/180.2 |

FOREIGN PATENT DOCUMENTS

| | | | |
|---|---|---|---|
| 0946311 | 5/1949 | Fed. Rep. of Germany | 24/458 |
| 3003176 | 8/1981 | Fed. Rep. of Germany | 24/458 |

*Primary Examiner*—Howard N. Goldberg
*Assistant Examiner*—Taylor J. Ross
*Attorney, Agent, or Firm*—Robert B. Levy; D. J. Kirk

[57] ABSTRACT

A plurality of spring clips (30), each having an elongated central member (32) with first (40) and second (38) ends and a plurality of resilient arms (36) radially extending therefrom, are simultaneously transferred between a transfer plate (90) and a pallet (20). The first ends (40) of the member (32) are lockably engaged in the transfer plate (90) with the second ends (38) thereof positioned into apertures (24) in the pallet (20). The central member (32) is rotated to release the first ends (40) from the transfer plate (90) while simultaneously lockably engaging the second ends (38) to the pallet (20) to secure the clips (30) therein and to capture a chip carrier (10) between the ends of each arm (36) and the pallet (20).

2 Claims, 17 Drawing Figures

METHODS FOR TRANSFERRING SPRING CLIPS

This is a division of application Ser. No. 683,065, filed Dec. 18, 1984, now U.S. Pat. No. 4,582,245.

TECHNICAL FIELD

This invention relates to an automated technique for transferring an article, having an elongated central member with first and second ends and a plurality of resilient arms extending radially therefrom, between first and second bodies.

BACKGROUND OF THE INVENTION

Only recently have chip carriers been developed for the packaging of semiconductor chips. A chip carrier is typically comprised of a case having a cavity therein in which a semiconductor chip is fixedly mounted. The semiconductor chip is connected, either by way of solid wires or leads which extend through the case, to bonding pads on the exterior thereof to permit electrical connection to the chip. The case is covered by a lid which is hermetically sealed thereto.

To assure the hermetic seal between the case and the lid, a thin film of a eutectic alloy is deposited, in an earlier process, on the periphery of a major surface of the lid which will contact its associated case. The alloy will reflow when heated and, upon subsequent cooling, will form the desired seal. The case must be maintained in intimate contact with the lid during heating thereof to prevent the lid from floating during the reflow of the eutectic alloy. In the past, various types of spring clips have been used to apply pressure to the lid and case during heating. One such spring clip has the configuration similar to that of a clothespin where the case and the lid of a chip carrier are held closely to one another between the tines of the spring clip. This type of clip can be configured to typically hold six chip carriers. The clip itself, with the captured chip carriers therein, is ultimately placed in a furnace to reflow the solder to seal the lids onto the cases.

These known spring clips have not proven satisfactory from the standpoint that they must be manually employed. This necessarily results in slow packaging time and incurs additional expense in the form of increased labor costs. Secondly, these prior spring clips are not easily adaptable to high volume production of chip carriers because of the additional time required to arrange a sizable number for largescale simultaneous heating.

A spring clip which obviates the foregoing problems is described in a U.S. Pat. No. 4,545,761 entitled "A Method and Apparatus for Securing Articles in Place on a Substrate" to J. S. Cartwright and J. Hurst which was filed in the U.S. Pat. and Trademark Office on Dec. 18, 1984 assigned to the instant assignee and is incorporated by reference herein. Important to the instant application is the fact that said spring clip is amenable to an automated assembly process for chip carriers.

Therefore, there is a need for an automated technique to insert and remove the spring clip, described in the above-referred to application, from a substrate utilized to contain and transport chip carriers during manufacture thereof. Further, the automated technique must be adaptable to the high volume production of chip carriers.

SUMMARY OF THE INVENTION

The foregoing need is met by one aspect of the invention which is a method for transferring an article having an elongated central member with first and second ends and a plurality of resilient arms extending radially therefrom. The method comprises the steps of: positioning a first planar body, having the first end of the central member lockably engaged therewith, proximate a second planar body having an opening therein; imparting relative movement to the first and second planar bodies to position the second end of the central member in the opening; rotating the elongated central member to unlock the first end of said member from the first planar body while simultaneously lockably engaging the second end thereof to the second planar body; and imparting relative movement to the first and second planar bodies to withdraw the first end of the elongated central member from the first planar body.

Advantageously, the use of the instant method and apparatus insures reliability of packaging by reducing the operator's involvement required by the prior art techniques. In addition, the packaging operation is converted from a long and costly process to a short and less expensive one because all of the components necessary to package a chip carrier can be included in one automated assembly. Furthermore, the instant apparatus facilitates the high volume manufacture of semiconductor chip carriers.

BRIEF DESCRIPTION OF THE DRAWINGS

For a better understanding of the invention, reference is made to the following description of an exemplary embodiment thereof, and to the accompanying drawings, wherein:

FIG. 1b an isometric view of the underside of the chip carrier of FIG. 1a;

FIG. 4b is an isometric view of a shaft component of the spring clip of FIGS. 3, 4a;

FIG. 6a is a schematic view of an operating station used to load the lids of the chip carriers of FIGS. 1a, 1b into the pallet of FIG. 2a;

FIG. 6b is a schematic view of an operating station used to load the cases of the chip carriers of FIGS. 1a, 1b into the pallet of FIG. 2a;

FIG. 6c is a schematic view of an operating station used to unload the chip carrier of FIGS. 1a, 1b from the pallet of FIG. 2a;

FIG. 7 is a partially cut-away top view of an operating station used to transfer the spring clip of FIGS. 3, 4a to and from the pallet of FIG. 2a;

FIG. 9b is a bottom view of the transfer plate of FIG. 9a; and

DETAILED DESCRIPTION

Figure 1A:
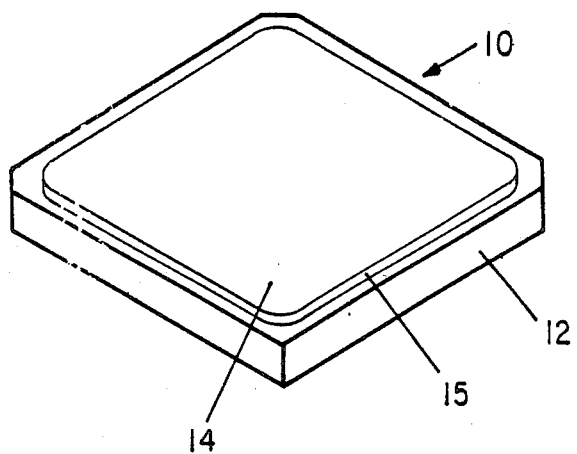
FIG. 1a is a top isometric view of a semiconductor chip carrier.
Figure 1B:
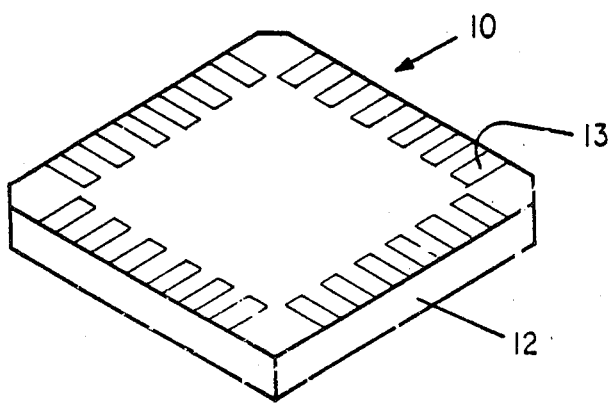

As illustrated in FIGS. 1a and 1b a chip carrier 10 is typically comprised of a case 12 having a cavity therein in which a semiconductor chip (not shown) is fixedly mounted. The semiconductor chip is connected, either by way of solid wires or leads which extend through the case 12, to bonding pads 13 (see FIG. 1b) on the exterior thereof to permit electrical connection to the chip. The case 12 is covered by a lid 14 which is hermetically sealed thereto by a thin film of eutectic alloy 15 (see FIG. 2a) such as 10UC Soldex alloy manufactured by Zirmex, Inc of Tuscon, Ariz. The alloy 15 is deposited during an earlier process on the periphery of a major surface of the lid 14 which will contact the case 12.

Figure 2A:
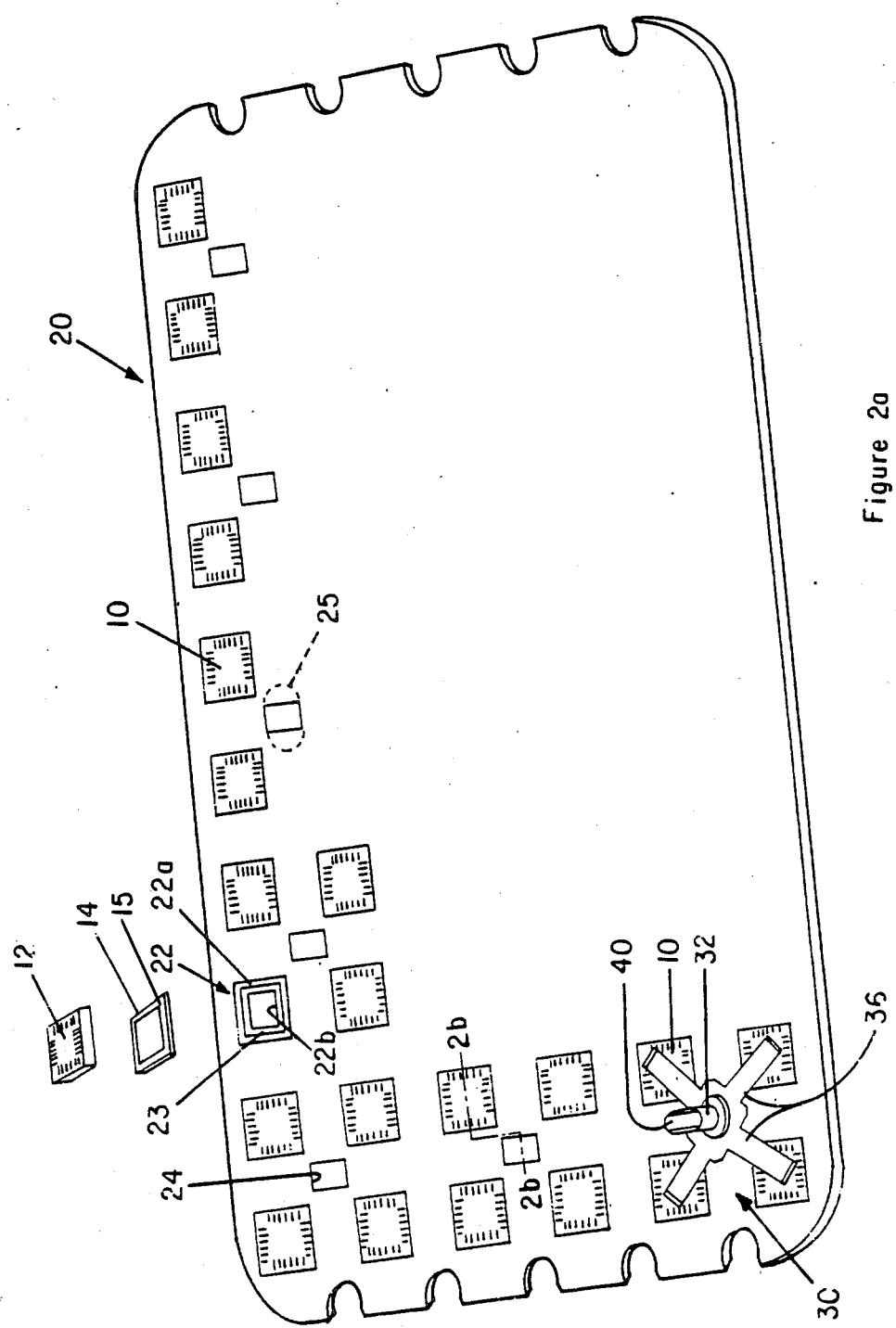
FIG. 2a is a top isometric view of a pallet containing the chip carrier of FIGS. 1a, 1b and a spring clip.

FIG. 2a shows the structure of a pallet 20 which is utilized to contain and transport the components (i.e., the case 12 and the lid 14) of the chip carriers 10 through the assembly process. The pallet 20 has formed therein a plurality of through cavities 22 (one shown). Each cavity 22 has a tapered opening 22a in the upper portion thereof and an opening 22b in the lower portion surrounded by a ledge 23 for supporting a lid 14. Each cavity 22 is sized and shaped to permit receipt of a case 12 above an associated underlying lid 14 (see also FIG. 2b). In an exemplary embodiment, the cavities 22 are arranged in a ten row by six column array.

Figure 2B:
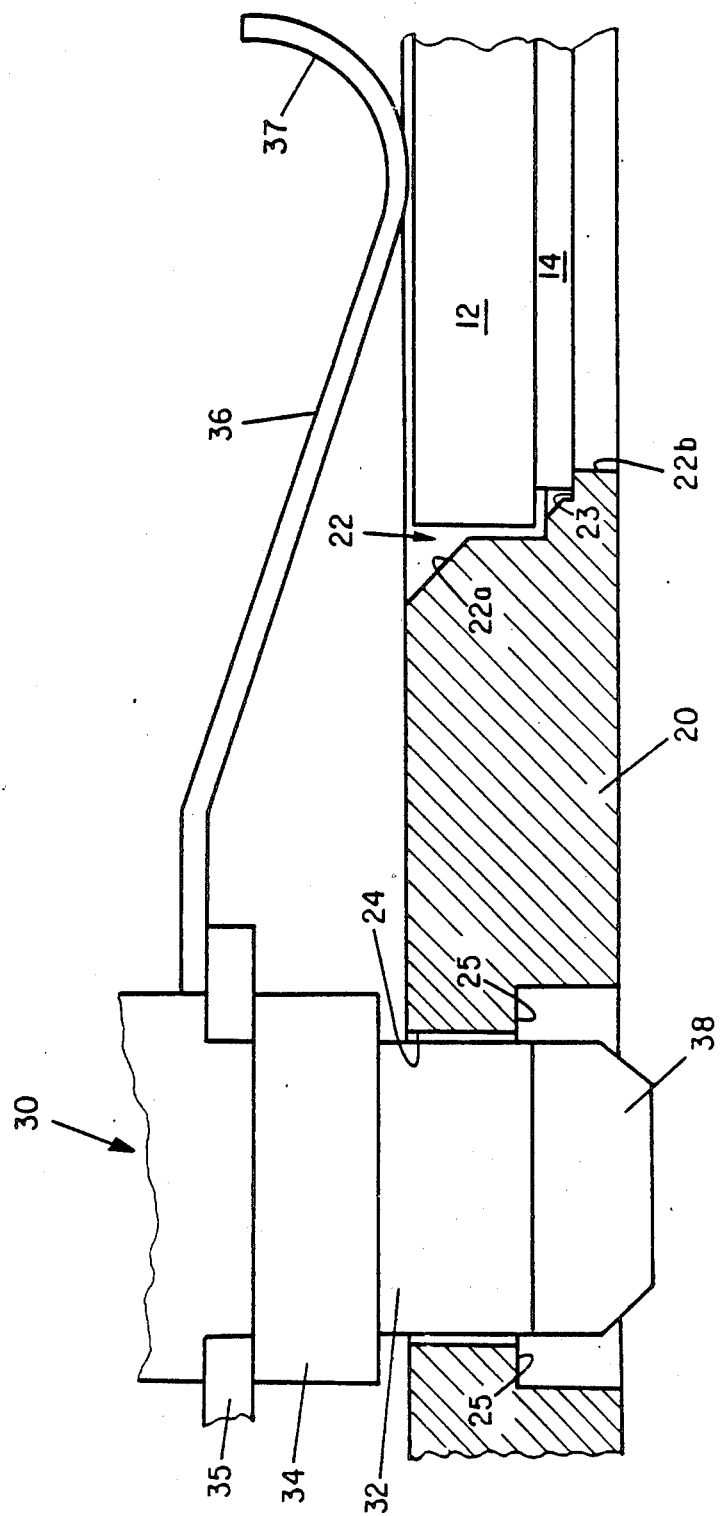
FIG. 2b is a partial cross-sectional view of a receiving passage and a cavity of the pallet taken along 2b—2b shown in FIG. 2a with a spring clip 30 inserted therein.

The pallet 20 also has formed therein a plurality of through receiving passages 24 (also see FIG. 2b). The passages 24 are arranged in a five row by three column array in such a manner that a group of four cavities 22 surround one passage. FIG. 2b shows a cross-sectional view of a portion of the pallet 20 depicting the receiving passage 24 having shoulders 25 formed therein and a cavity 22 with a chip carrier lid 14 and case 12 positioned therein. Also depicted in FIGS. 2a, 2b is a spring clip 30 which is inserted into a corresponding passage 24.

Figure 3:
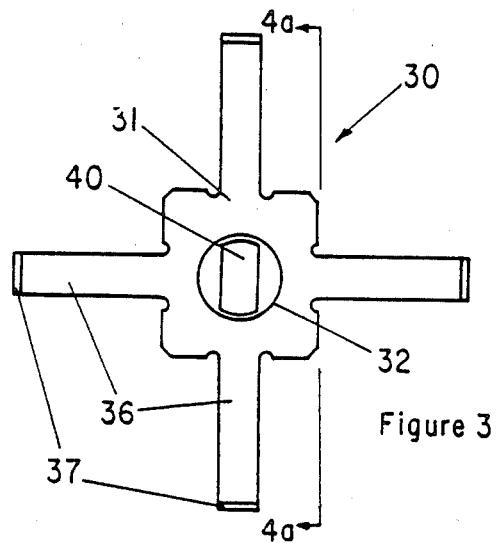
FIG. 3 is a top view of the spring clip which is inserted in the pallet of FIGS. 2a, 2b.
Figure 4A:
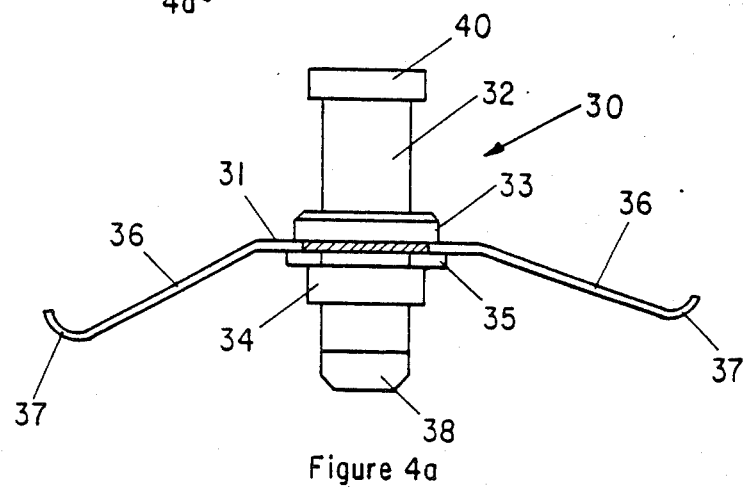
FIG. 4a is a partial cross-sectional view of the spring clip taken along 4a—4a shown in FIG. 3.
Figure 4B:
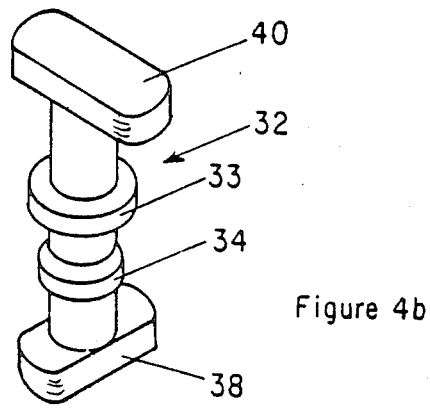

FIGS. 3, 4a, 4b show top, side and isometric views, respectively, of the spring clip 30 in detail. The spring clip 30 comprises an elongated member or central shaft 32 which extends through a passage (not shown) in a thin square metal plate 31. The metal plate 31 is loosely carried on the central shaft 32 between a pair of annular spaced-apart shoulders 33,34. In practice, the outer diameter of the lower shoulder 34 is smaller than the diameter of the passage through the plate 31 which in turn is smaller than the outer diameter of the upper shoulder 33. A small "e" ring 35 engages the central shaft 32 above the shoulder 34 to keep the metal plate 31 from slipping off the shaft 32. The plate 31 has four outstretched resilient arms 36, each sloping downwardly from a separate one of the sides thereof. Typically, each arm 36 has an upturned end 37.

As shown in FIG. 4b, the lower end 38 of the central shaft 32 is oblong-shaped and is sized for insertion into a corresponding through receiving passage 24 in the pallet 20. The upper end 40 of the central shaft 32 also has an oblong shape whose long dimension is oriented 90° from that of the lower end 38. The long dimension of the lower and upper ends 38 and 40, respectively, are substantially normal to the axis of the central shaft 32.

Referring to FIG. 2b, in order to insert the spring clip 30 into a receiving passage 24, the shaft 32 is rotated such that the orientation of the long dimension of its lower end 38 is in alignment with the length of the surface opening of the passage 24. The shaft 32 is then inserted into the passage 34 without resistance because the upper dimension of the passage is sized to accept the lower end 38. As the shaft 32 is inserted, the ends 37 of the arms 36 initially contact the chip carrier case 12, also without resistance. Thereafter, a downward force must be exerted to continue the shaft 32 insertion. The shaft 32 enters the passage 24 until the annular shoulder 34 contacts the surface of pallet 20 and entry is stopped. The shaft 32 is then rotated once more in order that the long dimension of the lower end 38 is oriented 90° from its bearing when it was initially inserted. The long dimension of the lower end 38 is effectively positioned underneath the passage shoulders 25 and, consequently, the spring clip 30 cannot be lifted out of passage 24. The tolerances involved are such that arms 36 of an inserted spring clip 30, after being so positioned, extend over and press against each of the chip carrier cases 12 in the surrounding cavities 22. Note that the area of any one arm 36 in contact with the case 12 is minimized because the upturned end 37 directs all the force exerted by the arm 36 to a single line on the case 12.

Figure 5:
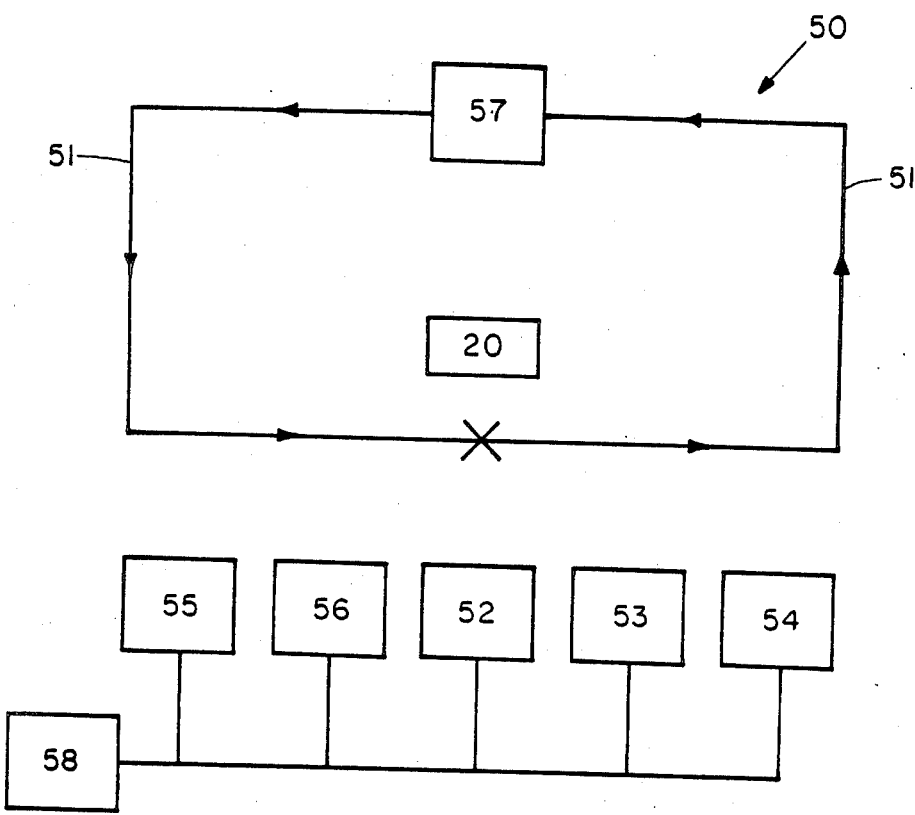
FIG. 5 is a block diagram of an automated assembly process the chip carrier of FIGS. 1a, 1b.

An automated chip carrier assembly process 50 is illustrated in block form in FIG. 5. The pallet 20 (see FIG. 2a) within which the chip carriers 10 are to be fabricated travels along a conveyor 51. In an exemplary embodiment, the conveyor is a looped accumulating roller conveyor manufactured by Shuttleworth, Inc. of Huntington, Ind. The assembly process 50 utilizes five operating stations, each located along the conveyor 51.

A first station 52 loads carrier lids 14 into the cavities 22 of the pallet 20 carried by the conveyor 51. At a second station 53 cases 12 are deposited in the pallet 20 to overlie the lids 14. A third station 54 installs spring clips 30 into the pallet 20. At a fourth station 55 the spring clips 30 are removed from the pallet 20 which then passes to a fifth station 56 where the completed sealed chip carriers 10 are themselves removed. The conveyor 51 also passes through a furnace 57 which is situated therealong downstream of the third station 54 and upstream of the fourth station 55. An exemplary furnace 57 is a Tempress infrared furnace, made by Lindburg, Inc. of Watertown, Wis., which supplies heat and nitrogen via a muffle. A control station 58 directs and coordinates all the activities of the aforementioned stations of the assembly process 50 in a well known manner.

Figure 6A:
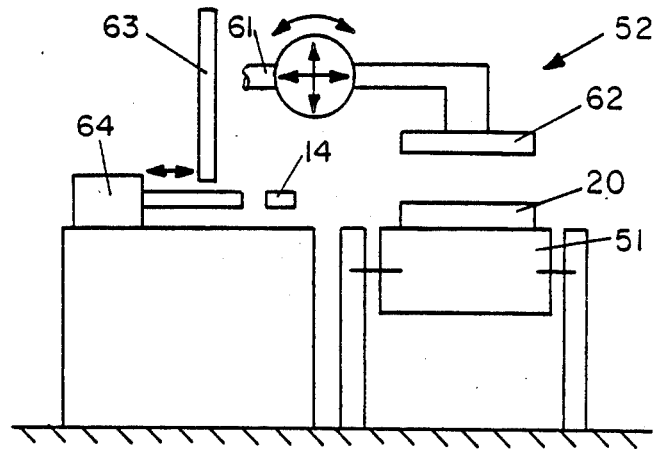
Figure 6B:
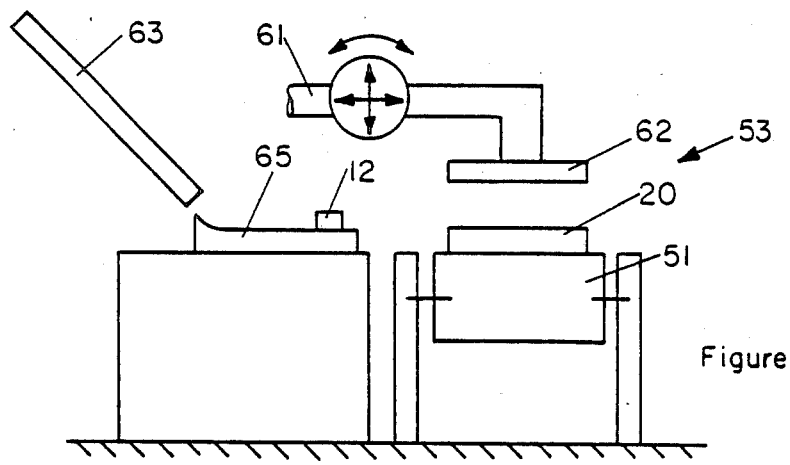
Figure 6C:
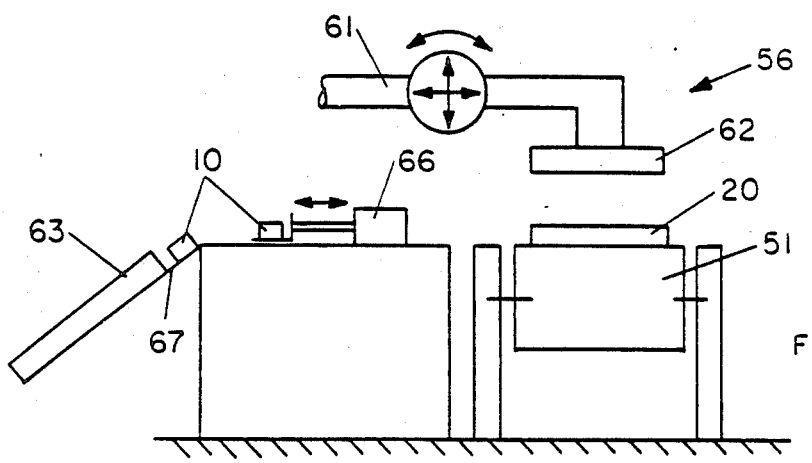

FIGS. 6a, 6b and 6c are schematic views of the loading stations 52, 53 and the removal station 56, respectively, which are similar in construction. Robots 61 (e.g., Seiko model 700) utilizing vacuum pick-up wands 62 for robot end effectors can be used for the removal and loading operations. The pick-up wands are described in a copending application Ser. No. 632,164 entitled "Vacuum Pick and Place Robotic Hand" to R. H. Cushman and C. Hoegermeyer filed in the U.S. Pat. and Trademark Office on July 18, 1984, assigned to the instant assignee and is incorporated by reference herein. The wands 62 are adaptable to handle one row of chip carrier components (i.e., lids 14 or cases 12) during a cycle (e.g., 10 components). Storage sticks 63 are hollow elongated containers which can hold a plurality of cases 12 or lids 14. One type, which is plastic and manufactured by Thielex Plastics Corporation of Piscataway, N.J., is sized and shaped to hold a plurality of lids 14 one on top of another; the other type, which is aluminum and manufactured by Minelex Corporation of Whitehouse Station, N.J., is sized and shaped to hold a plurality of cases 12 or sealed chip carriers 10 end to end.

At the first station 52 (FIG. 6a), individual lids 14 are gravity fed from a group of ten parallel sticks 63 (only one shown). The ten lids 14 are then pushed, via a shuttle plate 64, from underneath the sticks 63 into position for the pick-up wand 62. At the second station 53 (FIG. 6b), individual chip carrier cases 12 are unloaded from a stick 63 one at a time into a walking beam 65 which positions ten cases 12 (i.e., one row) for pick up by the wand 62. The removal station 56 (FIG. 6c), in any one cycle, transfers a row of sealed chip carriers 10 from the pallet 20 into a channel (not shown) where the carriers 10 are pushed by an automated arm 66 onto an incline 67 so as to slide the carriers 10 into a storage stick 63 one after another.

Figure 7:
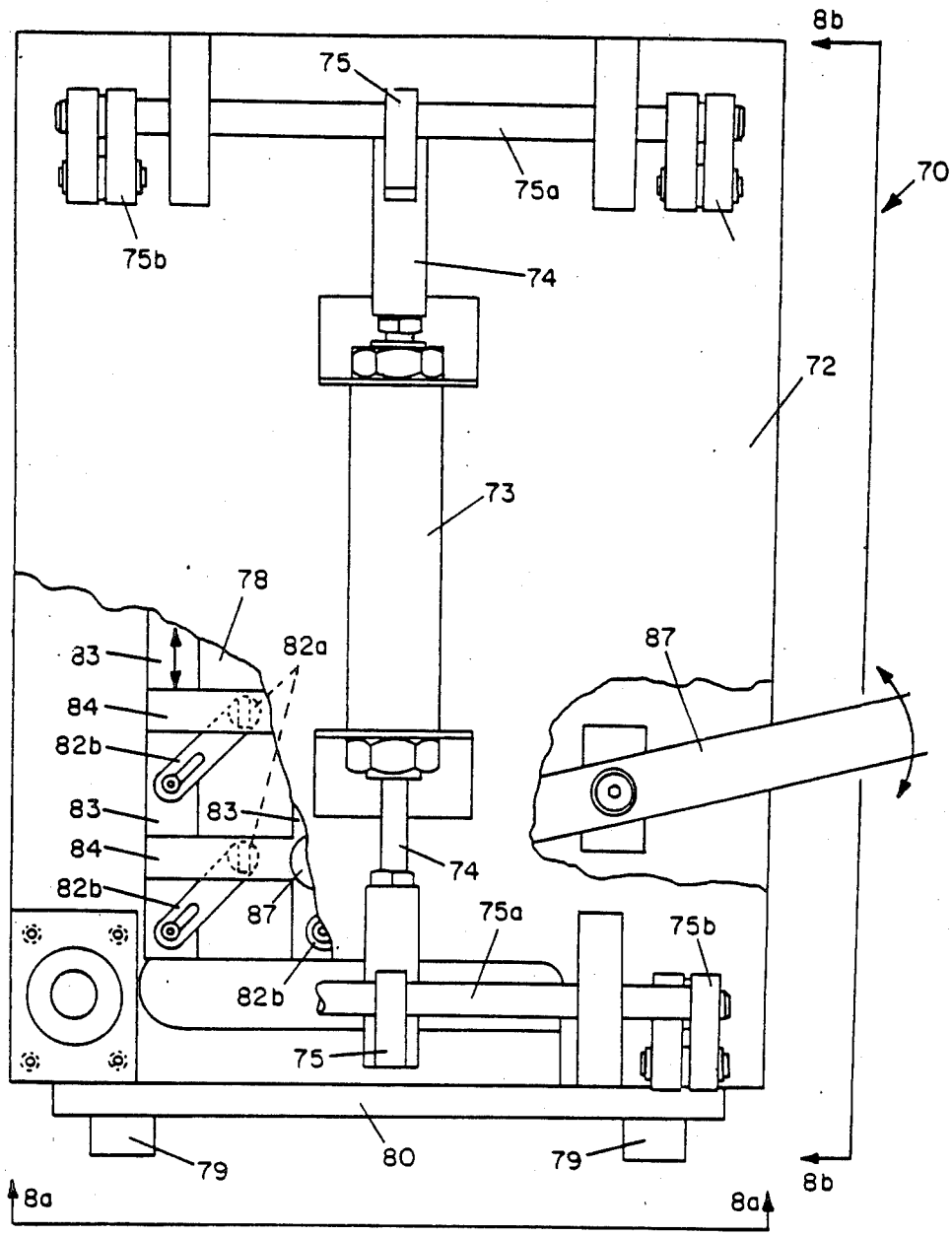
Figure 8A:
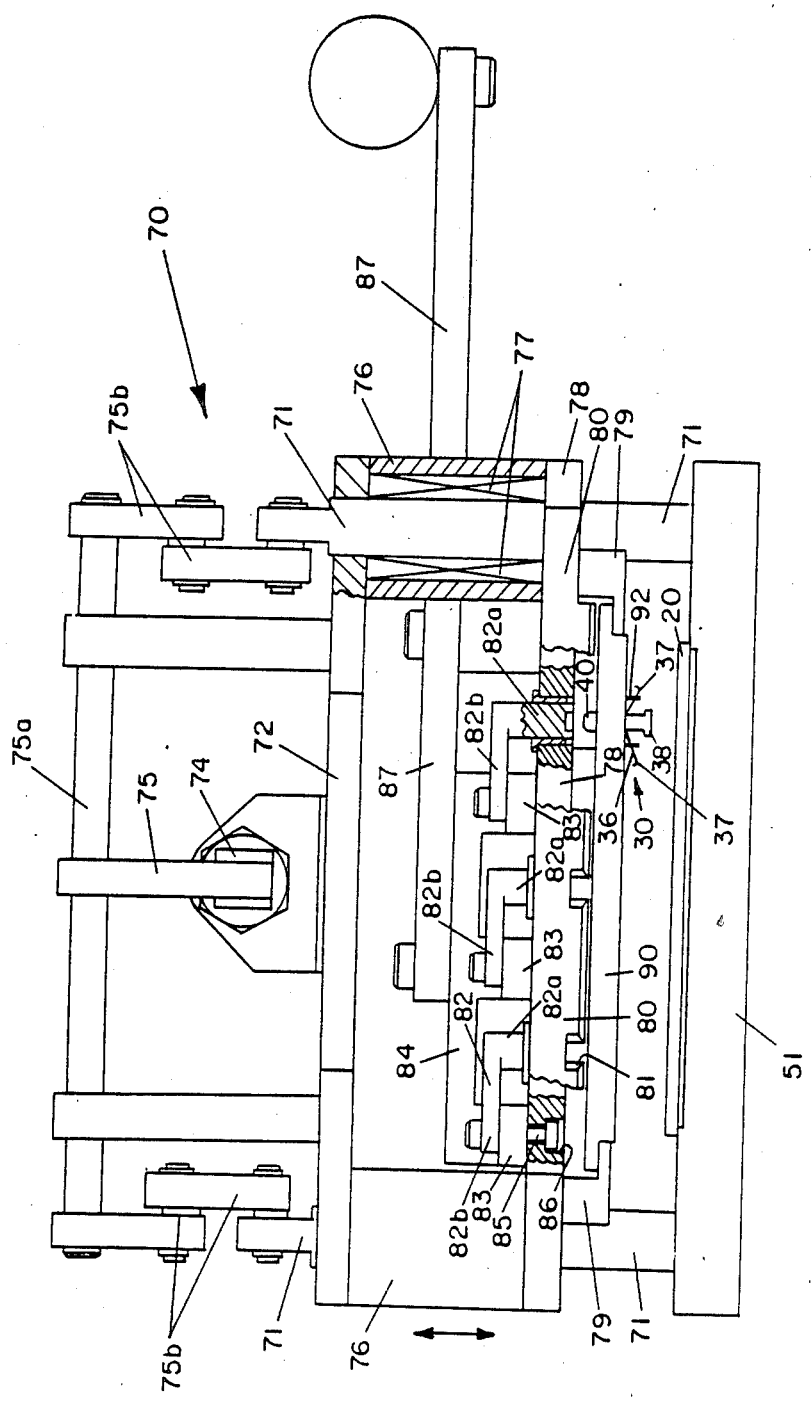
FIG. 8a is a partially cut-away end view of the operating station taken along 8a—8a shown in FIG. 7.
Figure 8B:
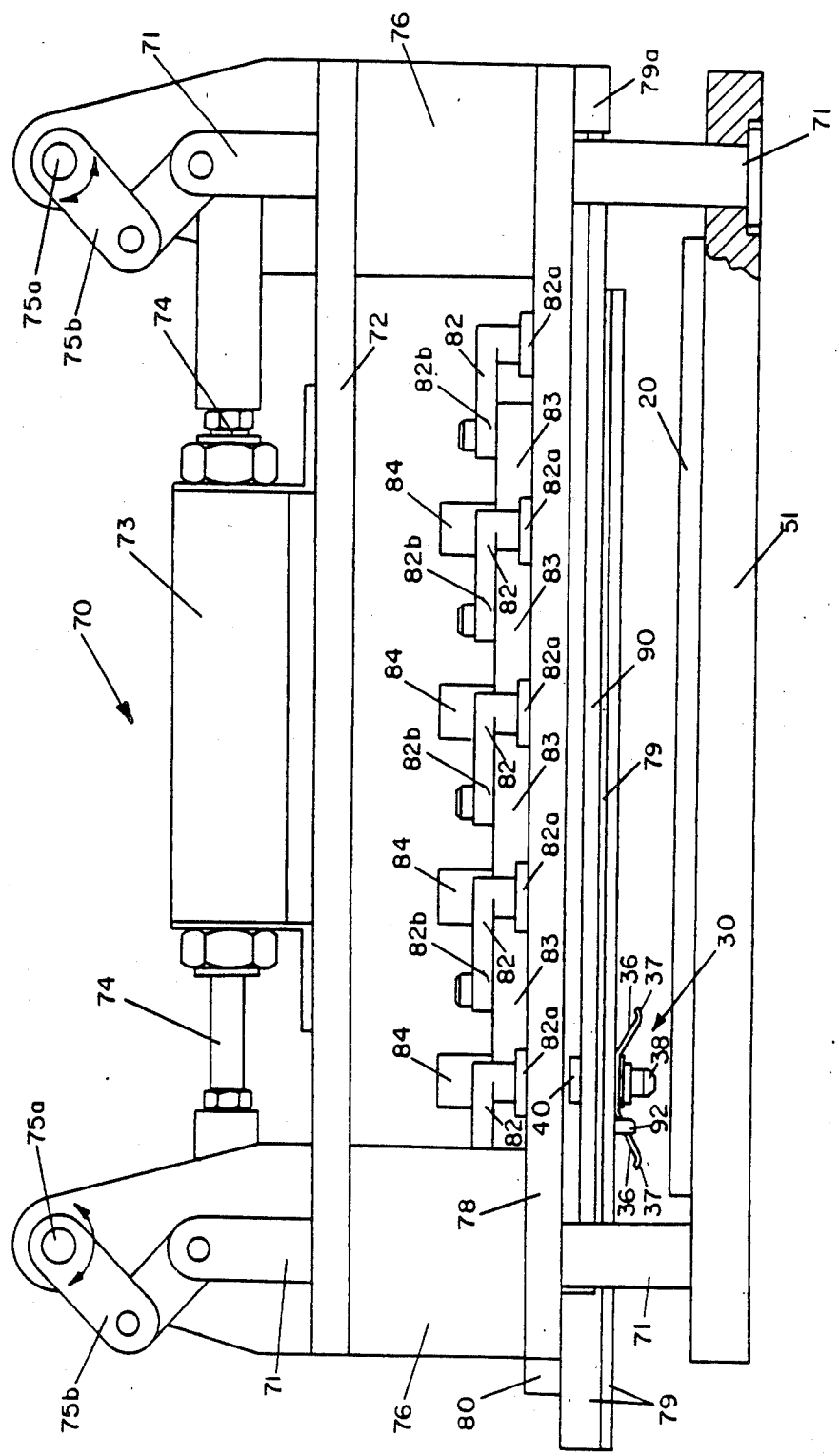
FIG. 8b is a side view of the operating station without an arm component taken along 8b—8b shown in FIG. 7.

The third station 54 and the fourth station 55 employ identical machines. FIGS. 7, 8a and 8b are top, end and side views, respectively, of such a typical machine 70 used for transferring the spring clips 30 to and from the pallet 20. The machine 70 includes two pairs of vertical posts 71, the posts of each pair are located on opposite sides of the conveyor 51 which carries the pallet 20 through the assembly process. The posts 71 slidably support an upper plate 72 which, in turn, supports a hydraulic cylinder 73. The shafts 74 of the cylinder 73 are each connected, via joint arrangements not shown, to a first linkage 75 which is also fixedly pinned to a second linkage 75a. The second linkages 75a, which are rotatable (see FIG. 8b), are then coupled to the posts 71 by links 75b. The upper plate 72 is situated atop a plurality of housings 76 that are each slidably mounted by ball bushings 77 to the vertical posts 71 for movement therealong. Consequently, the upper plate 72 moves in conjunction with the housings 76.

The housings 76 overlie and are fixedly connected to a lower plate 78. The lower plate 78 is provided with a pair of guides 79, extending from the lower surface thereof for engaging opposing edges of a sidably removable transfer plate 90 containing a plurality of spring clips 30 (one shown). The lower plate 78 also is provided with a stop 79a (see FIG. 8b) extending from the lower surface for halting the movement of the transfer plate 90 when slid along guides 79 (FIG. 8b). An aligning comb 80, attached to the lower plate 78, is located between the guides 79 at the entry point for the transfer plate 90. The comb 80 has a plurality of parallel channels 81 which the upper ends 40 of the spring clips 30 slidably pass through as the transfer plate 90 is slid into the station 70. The channels 81 are shaped to align the upper ends 40 in a predetermined orientation as they pass therethrough.

A plurality of ratchets 82 have first ends 82a rotatably mounted in the lower plate 78 and second ends 82b each pivotally connected to one of a plurality of slides 83. The slides 83, in turn, are connected to one another via linkages 84 as well as slidably connected to the underlying lower plate 78 via a plurality of pins 85 which slidably move along slots 86 within the lower plate 78 (FIG. 8a). The slides 83 are also collectively connected to an arm 87 for gripping by an operator. Note that the ratchets 82 are arranged so that the first ends 82a are in a five row by three column array, matching the array of passages 24 in pallet 20, and such that the associated second ends 82b of any one column are pivotally connected to one slide 83.

Figure 9A:
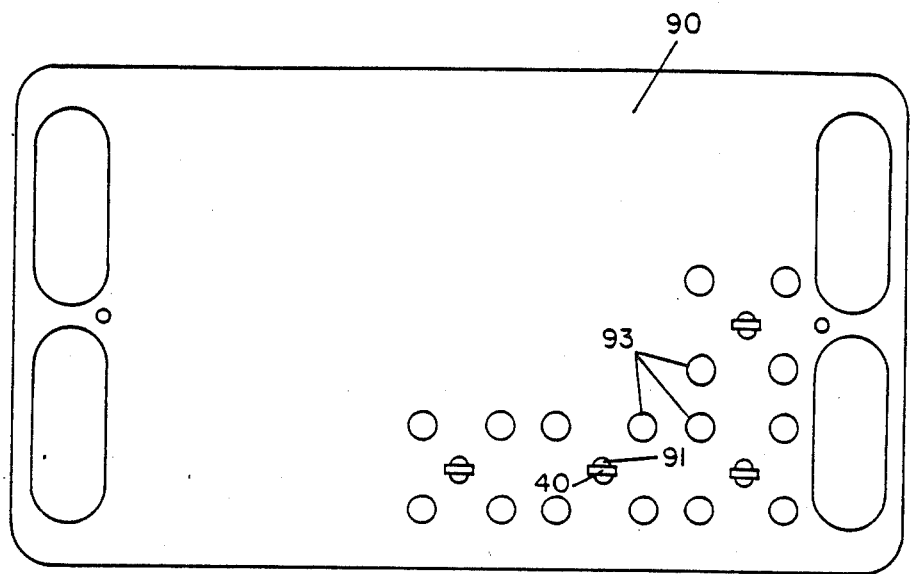
FIG. 9a is a top view of a transfer plate associated with the operating station of FIGS. 7, 8.
Figure 9B:
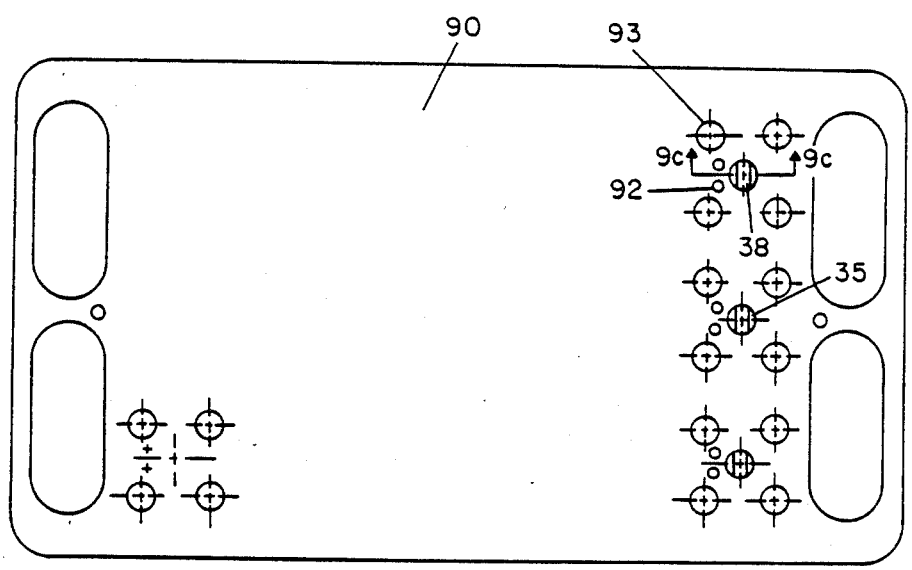
Figure 9C:
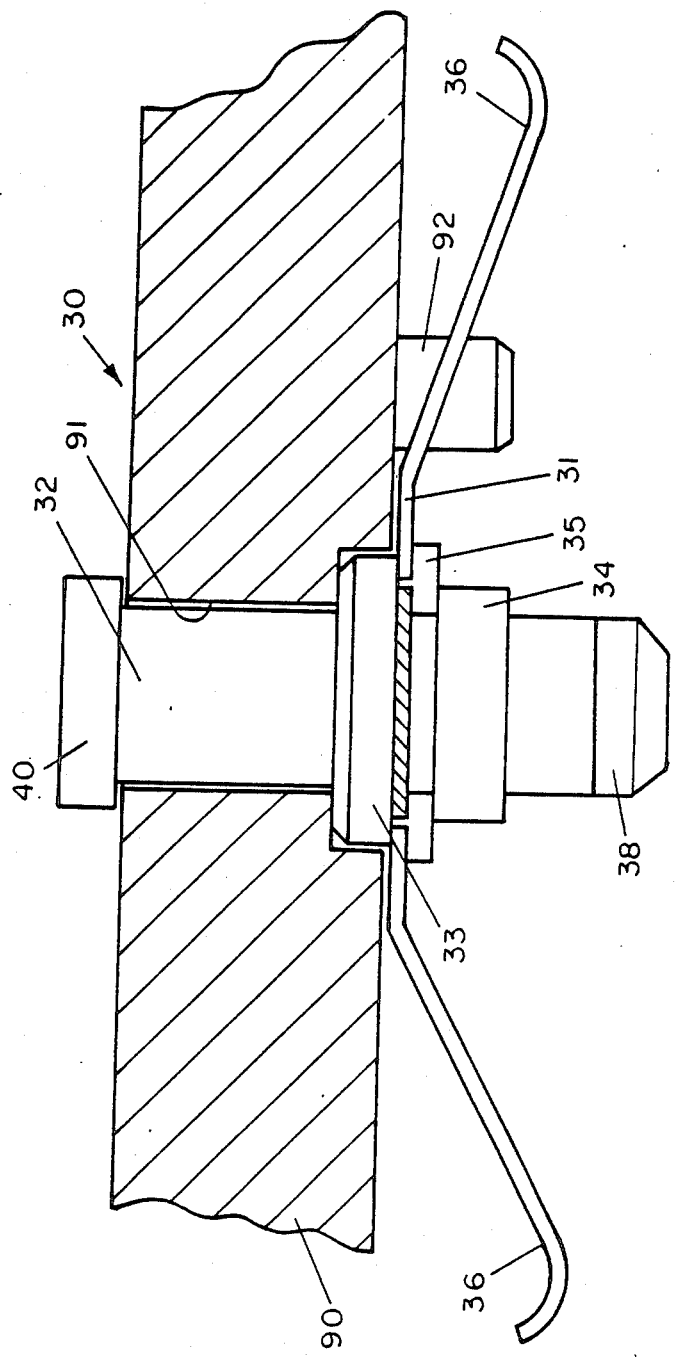
FIG. 9c is a partial cross-sectional view of the transfer plate taken along 9c—9c shown in FIG. 9b.

FIGS. 9a, 9b depict a top and bottom view, respectively, of the planar transfer plate 90 which acts as a carrier for the spring clips 30 for the purpose of automatic insertion into and removal from the pallet 20. The transfer plate 90 is provided with a plurality of receiving through passages 91 therein which are arranged in the same spaced relationship as the receiving passages 22 in the pallet 20 (shown in FIG. 2a). The shaft 32 of each spring clip 30 slidably fits into one passage 91 and is retained within via its upper end 40 whose long dimension, when so positioned, bridges the top surface opening of the passage 91 and rests on the upper surface of the plate 90 (see also FIG. 9c). The transfer plate 90 is also provided with a plurality of depending protrusions 92 (also see FIG. 8b), each spaced from an associated one of the passages 91. In addition, note that the plate 90 has a plurality of through holes 93 therein which surround the receiving passages 91 and serve to lighten the weight of the plate 90.

In operation, the pallet 20 is placed by an operator on the conveyor 51 at the point marked x which moves it to the first station 52 (FIG. 5). At the first station 52, the lids 14 are loaded into each of the cavities 22 in the pallet 20. As shown in FIG. 6a, the lids 14 slide down the sticks 63 by gravity. The lids 14, which number ten in an exemplary embodiment, are then pushed via the shuttle plate 64 from underneath the sticks 63. The wand 62 picks up the lids 14 and deposits them into a row of cavities 22 of the pallet 20 (see FIG. 2a). As the shuttle plate 64 withdraws, ten more lids 64 fall from the sticks 63 and the procedure is repeated until the array of passages 22 in the pallet 20 is filled with lids 14. The pallet 20 is then moved along the conveyor 51 to the second station 53. Chip carrier cases 12, fed seriatim from the stick 63 onto a walking beam 65 (FIG. 6b), are picked up by the wand 62 once a row of cases (e.g., ten) are positioned thereon. The robot 61 then moves the wand 62 over the pallet 20 and the cases 12 are deposited into the pallet cavities 22 above the underlying lids 14 therein.

After the pallet 20 leaves the second operating station 53, it moves to the third operating station 54. At that station, a plurality of spring clips 30 (FIGS. 3, 4a, 4b) are simultaneously inserted into the pallet 20 from the transfer plate 90 (FIGS. 9a, 9b) which is previously filled with spring clips 30. As shown in FIGS. 2a, 2b the insertion is such that the end 37 of each arm 36 of each clip 30 urges a case 12 in an adjacent cavity 22 into intimate contact with the underlying lid 14 with the eutectic alloy 15 therebetween.

Referring to FIGS. 7, 8a and 8b, in order to transfer the spring clips 30 from the plate 90 to the pallet 20, the transfer plate 90 is slid along the guides 79 of the lower plate 78 until halted by stop 79a. Note that the plate 90 has a full complement of spring clips 30 therein. As the plate 90 is inserted along the guides 79, the upper ends 40 of each row of spring clips 30 slide through one channel 81 of the comb 80 and the long dimensions of each end become oriented in the same direction. This action also orients the shafts 32 so that the lower end 38 of each spring clip 30 is in registration with the corresponding receiving passage 24 of the pallet 20 on the conveyor 51 and the upper end 40 is in registration with the opening of a separate one of a plurality of ratchet ends 82a once the end of the plate 90 abuts the stop 79a.

The cylinder 73, when actuated, causes the shafts 74 to move linearly which, in turn, causes the ends of the first linkages 75, connected thereto, to move in an arcuate fashion. The second linkages 75a, fixedly pinned to the other ends of the first linkages 75, are caused to rotate by the movement of the first linkages 75. The linkage 75a is fixedly connected to the linkage 75b which rotates to a substantially vertical position which, in turn, displaces the upper plate 72, the housings 76, the lower plate 78 and the transfer plate 90 downwardly, in concert. The lower end 38 of each spring clip 30 in the transfer plate 90 is positioned into its corresponding receiving passage 24 (see FIGS. 2a, 2b) in the pallet 20. As the downward movement continues, the arms 36 of the spring clips 30 contact the chip carrier cases 12 in the pallet 20 and the transfer plate 90 lifts off the guides 79 when the arms 36 contact the cases. Note that as the arms 36 recoil, the ends 37 do not contact the transfer plate 90 because each end 37 is given clearance by a corresponding through hole 93 (see FIG. 9b) which is so positioned. The first end 82a of each ratchet 82 in the lower plate 78 then engages the upper end 40 of its associated spring clip 30. Thereafter, the downward movement is halted and the arm 87 is rotated causing the connected slides 83 to move linearly along slots 86 (FIG. 8a) in a direction opposite to that of the arm movement (FIG. 7). The second ends 82b of the ratchets 82 pivot as the slides 83 move causing the first ends 82a of the ratchets 82 to rotate.

The ratchet action rotates the central shaft 32 of each clip 30 through an arc of 90° such that the long dimension of the upper end 40 aligns with opening of the passage 91 instead of resting on the surface of the transfer plate 90 (FIG. 9c) while the long dimension of the lower end 38 positions beneath the shoulders 25 of the receiving passage 24 of the pallet 20 (FIG. 2a). Thus, each spring clip 30 simultaneously unloads from the transfer plate 90 and engages the pallet 20. The cylinder 73 is then actuated to return to its original position causing the transfer plate 90, the lower plate 78, the housings 76 and the upper plate 72 to move upwardly. The lower end 38 engages the shoulders 25 and the upper end 40 slidably passes through the passage 91 in the plate 90 as the plate moves away from the pallet 20. Note that the depending protrusions 92 (FIGS. 9b, 9c) of the transfer plate 90 keep the arms 36 of each spring clip 30 from rotating during the twisting of its shaft 32 by acting as stops. In this way each of the arms 36 of each spring clip is kept in registration with an associated case 12 in one of the pallet cavities 22 as the spring clip is transferred between the transfer plate 90 and the pallet 20.

Referring to FIG. 5, after the spring clips 30 have been inserted into the pallet 20 at the third operating station 54, the pallet 20 is then moved along the conveyor 51 into the furnace 57. Typically, the pallet 20 remains in the furnace 57 for approximately fifteen minutes. As the pallet 20 passes through, the temperature is gradually increased to reach a maximum of 345° C. (approximately two minutes are spent above the 320° C. level). In the furnace 57, the cases 12 and the lids 14 are heated to reflow the eutectic alloy 15 on the periphery of the lids 14 to establish a hermetic seal with the overlying case 12 when cooled.

Upon leaving the furnace 57 the pallet 20 moves along the conveyor 51 to the fourth operating station 55 which employs an apparatus identical in construction to the apparatus of the third operating station 54. At the station 55 the spring clips 30 are removed, for later reuse, from the pallet 20 by the same ratchet action used to insert the spring clips.

Briefly, the pallet 20 passes via the conveyor 51 into apparatus 70 (FIGS. 7, 8a, 8b). The upper plate 72, the housings 76, the lower plate 78 and an empty transfer plate 90 are displaced downwardly, by the action of the cylinder 74, so each shaft 32 of each spring clip 30 in the pallet 20, being previously aligned at station 54, is urged into a corresponding passage 91 in the plate 90. The displacement is such that each upper end 40 also passes into an opening of a corresponding first end 82a of a ratchet 82.

The arm 87 is rotated so as to twist the second ends 82b of the ratchets 82 which are connected thereto via the slides 83. The ratchet action rotates each shaft 32 ninety degrees such that the long dimension of lower end 38 disengages the shoulders 25 of the passage 24 in the pallet 20 (FIG. 2a). The upper plate 72, the housings 76 and the lower plate 78 are then moved upward by cylinder 73 causing each upper end 40 to release from its ratchet 82. The long dimension of each upper end 40 bridges the top opening of the passage 91 in the transfer plate 90 so as to rest on the transfer plate surface. As the upward movement continues, the lower ends 38 of each spring clip 30 simultaneously slidably pass through the passages 24 as the transfer plate 90 moves away from the pallet 20.

The pallet 20 then moves from the fourth operating station 55 to the fifth operating station 56. Referring to FIG. 6c, each row of newly formed chip carriers 10 in the pallet 20 are picked up by wand 62 and transferred into a channel (not shown) on an adjacent surface. Once in the channel, the carriers 10 are pushed by an automated arm 66 into an incline 67 where the row of carriers 10 slide seriatim into a storage stick 63. The robot 61 repeats this procedure till the pallet 20 is emptied of carriers 10.

It is to be understood that the embodiments described herein are merely illustrative of the principles of the invention. Various modifications may be made thereto by persons skilled in the art without departing from the spirit and scope of the invention.

What is claimed is:

1. A method of transferring an article, having an elongated central member with first and second ends and a plurality of resilient arms extending radially therefrom, comprising the steps of:
   (a) positioning a first planar body, having the first end of the central member lockably engaged therewith, proximate a second planar body having an opening therein;
   (b) imparting relative movement to the first and second planar bodies to position the second end of the central member in the opening:
   (c) rotating the elongated central member to unlock the first end of said member from the first planar body while simultaneously lockably engaging the second end thereof to the second planar body; and
   (d) imparting relative movement to the first and second planar bodies to withdraw the first end of the elongated central member from the first planar body.

2. A method of transferring an article, having an elongated central member with first and second ends and a plurality of resilient arms extending radially therefrom, between first and second planar bodies, each having a passageway therethrough, comprising the steps of:

(a) positioning the first planar body proximate to the second planar body so that the central member, whose first end is lockably engaged with a passageway in one of said bodies, has the second end in registration with and positioned within a corresponding passageway in the other of said bodies;
(b) positioning a ratchet with a rotatable first end so that the first end of the ratchet engages one end of the central member;
(c) rotating the first end of the ratchet so that simultaneously the central member is rotated, the first end of the central member disengages the passageway in one body and the second end of the central member lockably engages the passageway in the other body; and
(d) moving the first planar body away from the second planar body so that the first end of the central member slidably releases from the first end of the ratchet and the passageway previously engaged therewith.

* * * * *